(12) United States Patent
Kim et al.

(10) Patent No.: US 11,910,527 B2
(45) Date of Patent: Feb. 20, 2024

(54) SUBSTRATE WITH ELECTRONIC COMPONENT EMBEDDED THEREIN

(71) Applicant: SAMSUNG ELECTRO-MECHANICS CO., LTD., Suwon-si (KR)

(72) Inventors: Song I Kim, Suwon-si (KR); Mi Sun Hwang, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 371 days.

(21) Appl. No.: 17/198,625

(22) Filed: Mar. 11, 2021

(65) Prior Publication Data
US 2022/0030710 A1 Jan. 27, 2022

(30) Foreign Application Priority Data
Jul. 27, 2020 (KR) .......................... 10-2020-0092956

(51) Int. Cl.
*H05K 1/18* (2006.01)
*H05K 1/11* (2006.01)
(Continued)

(52) U.S. Cl.
CPC ........ *H05K 1/111* (2013.01); *H01L 23/49822* (2013.01); *H01L 23/49838* (2013.01); *H05K 1/03* (2013.01); *H05K 1/185* (2013.01)

(58) Field of Classification Search
CPC .......... H05K 1/111; H05K 1/03; H05K 1/113; H05K 3/4602; H05K 2203/1469; H05K 1/185; H05K 2203/061; H05K 1/182–186; H05K 1/0271; H05K 2201/10674; H01L 23/49822; H01L 23/49838; H01L 23/49816; H01L 23/5389; H01L 24/00; H01L 23/48; H01L 24/19; H01L 21/568;
(Continued)

(56) References Cited

U.S. PATENT DOCUMENTS

2007/0069363 A1* 3/2007 Kawabata ............... H01L 24/82
257/E23.179
2008/0052906 A1 3/2008 Lee et al.
(Continued)

FOREIGN PATENT DOCUMENTS

KR 10-2006-0134512 A 12/2006
KR 10-0699237 B1 3/2007
(Continued)

OTHER PUBLICATIONS

English Translation KR102281458 Published Dec. 31, 2015 (Year: 2015).*

*Primary Examiner* — Steven T Sawyer
(74) *Attorney, Agent, or Firm* — Morgan, Lewis & Bockius LLP

(57) ABSTRACT

A substrate with an electronic component embedded therein includes: a core layer having a through-portion; an electronic component disposed in the through-portion; an encapsulant disposed on a lower surface of the core layer, disposed in at least a portion of the through-portion, and covering at least a portion of a lower surface of the electronic component; and a build-up structure disposed on an upper surface of the core layer, and including a plurality of insulating layers, a plurality of wiring layers, and a plurality of via layers.

21 Claims, 16 Drawing Sheets

(51) Int. Cl.
*H01L 23/498* (2006.01)
*H05K 1/03* (2006.01)

(58) Field of Classification Search
CPC ........... H01L 23/50; H01L 2224/04105; H01L 2224/12105; H01L 2224/16227; H01L 2224/18; H01L 2224/24195; H01L 2224/32145; H01L 2224/32225; H01L 2224/48091; H01L 2224/48227; H01L 2224/73204; H01L 2224/73253; H01L 2224/73265; H01L 2225/0651; H01L 2225/06517; H01L 2225/06558; H01L 2225/1035; H01L 2225/1041; H01L 2225/1058; H01L 2924/00014; H01L 2924/15311; H01L 2924/181; H01L 2924/19105; H01L 2924/3025; H01L 2924/3511
See application file for complete search history.

(56) References Cited

U.S. PATENT DOCUMENTS

| 2012/0013021 | A1* | 1/2012 | Kobayashi | H01L 24/19 |
| | | | | 257/E21.597 |
| 2012/0032335 | A1* | 2/2012 | Kariya | H01L 21/568 |
| | | | | 257/772 |
| 2012/0227261 | A1* | 9/2012 | Inui | H05K 1/0206 |
| | | | | 29/849 |
| 2014/0041923 | A1* | 2/2014 | Hisada | H05K 1/115 |
| | | | | 174/266 |
| 2014/0070396 | A1* | 3/2014 | Kyozuka | H01L 23/5389 |
| | | | | 257/698 |
| 2014/0182889 | A1* | 7/2014 | Shin | H01L 24/19 |
| | | | | 174/251 |
| 2015/0027757 | A1* | 1/2015 | Shin | H05K 3/107 |
| | | | | 174/255 |
| 2015/0062848 | A1* | 3/2015 | Lee | H01L 24/19 |
| | | | | 156/60 |
| 2016/0099213 | A1* | 4/2016 | Tae | H01L 24/82 |
| | | | | 257/777 |
| 2016/0174381 | A1* | 6/2016 | Lee | H05K 3/4682 |
| | | | | 156/247 |
| 2016/0322295 | A1* | 11/2016 | Kobayashi | H05K 3/4682 |
| 2016/0338202 | A1* | 11/2016 | Park | H01L 24/00 |
| 2017/0271266 | A1* | 9/2017 | Kim | H01L 23/5389 |
| 2018/0138029 | A1* | 5/2018 | Kim | H01L 21/76841 |
| 2019/0189589 | A1* | 6/2019 | Jung | H01L 21/481 |
| 2020/0161279 | A1* | 5/2020 | Mok | H01L 23/5384 |

FOREIGN PATENT DOCUMENTS

| KR | 10-0763345 A | 10/2007 |
| KR | 10-0763345 B1 | 10/2007 |

* cited by examiner

SUBSTRATE WITH ELECTRONIC COMPONENT EMBEDDED THEREIN

CROSS-REFERENCE TO RELATED APPLICATION(S)

This application claims benefit of priority to Korean Patent Application No. 10-2020-0092956 filed on Jul. 27, 2020 in the Korean Intellectual Property Office, the disclosure of which is incorporated herein by reference in its entirety.

BACKGROUND

The present disclosure relates to a substrate with an electronic component embedded therein.

As electronic devices in the information technology (IT) field, including mobile phones, have become lighter and thinner, in response to technical demand therefor, a technology in which an electronic component such as an integrated circuit (IC) is inserted into a printed circuit board is required, and a technology in which an electronic component is embedded in the printed circuit board has been developed in recent years using various methods.

For example, a cavity-type substrate with an electronic component embedded therein needs a metal pattern that can serve as a stopper for processing the cavity. In this case, for signal transmission, a separate backside wiring layer is required, in addition to the wiring layer in which the metal pattern is formed on the rear surface of the electronic component. In addition, in order to attach an electronic component to a metal pattern, an adhesive film such as a die attach film (DAF) having a predetermined thickness is additionally required, and thus there is a limitation in thinning.

SUMMARY

An aspect of the present disclosure is to provide a substrate with an electronic component embedded therein having an asymmetrical shape, advantageous for thinning.

According to one of the various solutions proposed through the present disclosure, an electronic component is attached by using a property of an encapsulant and a characteristic of a process without a separate adhesive film, and in addition, a separately manufactured precursor for a build-up structure is introduced as a collective lamination process, and a substrate with an electronic component embedded therein having an asymmetrical shape, advantageous for thinning, is provided.

For example, according to an aspect of the present disclosure, a substrate with an electronic component embedded therein may include: a core layer having a through-portion; an electronic component disposed in the through-portion; an encapsulant disposed on a lower surface of the core layer, disposed in at least a portion of the through-portion, and covering at least a portion of a lower surface of the electronic component; and a build-up structure disposed on an upper surface of the core layer, and including a plurality of insulating layers, a plurality of wiring layers, and a plurality of via layers.

Alternatively, according to an aspect of the present disclosure, a substrate with an electronic component embedded therein may include: a core layer having a through-portion; an electronic component disposed in the through-portion; an encapsulant embedding at least a portion of the electronic component; and a build-up structure disposed on the core layer, and including a plurality of insulating layers, a plurality of wiring layers, and a plurality of via layers. A via of a first via layer as one of the plurality of via layers, and a via of a second via layer as another one of the plurality of via layers, may have a shape tapered in opposite directions.

Alternatively, according to an aspect of the present disclosure, a substrate with an electronic component embedded therein may include: a core layer having a through-portion; an electronic component disposed in the through-portion and including a connection pad disposed on a first surface of the electronic component; an encapsulant extending to cover at least a portion of the first surface and at least a portion of a second surface of the electronic component opposing the first surface; and a build-up structure disposed on a surface of the core layer, and including a plurality of first insulating layers, a plurality of first wiring layers, and a plurality of via layers.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
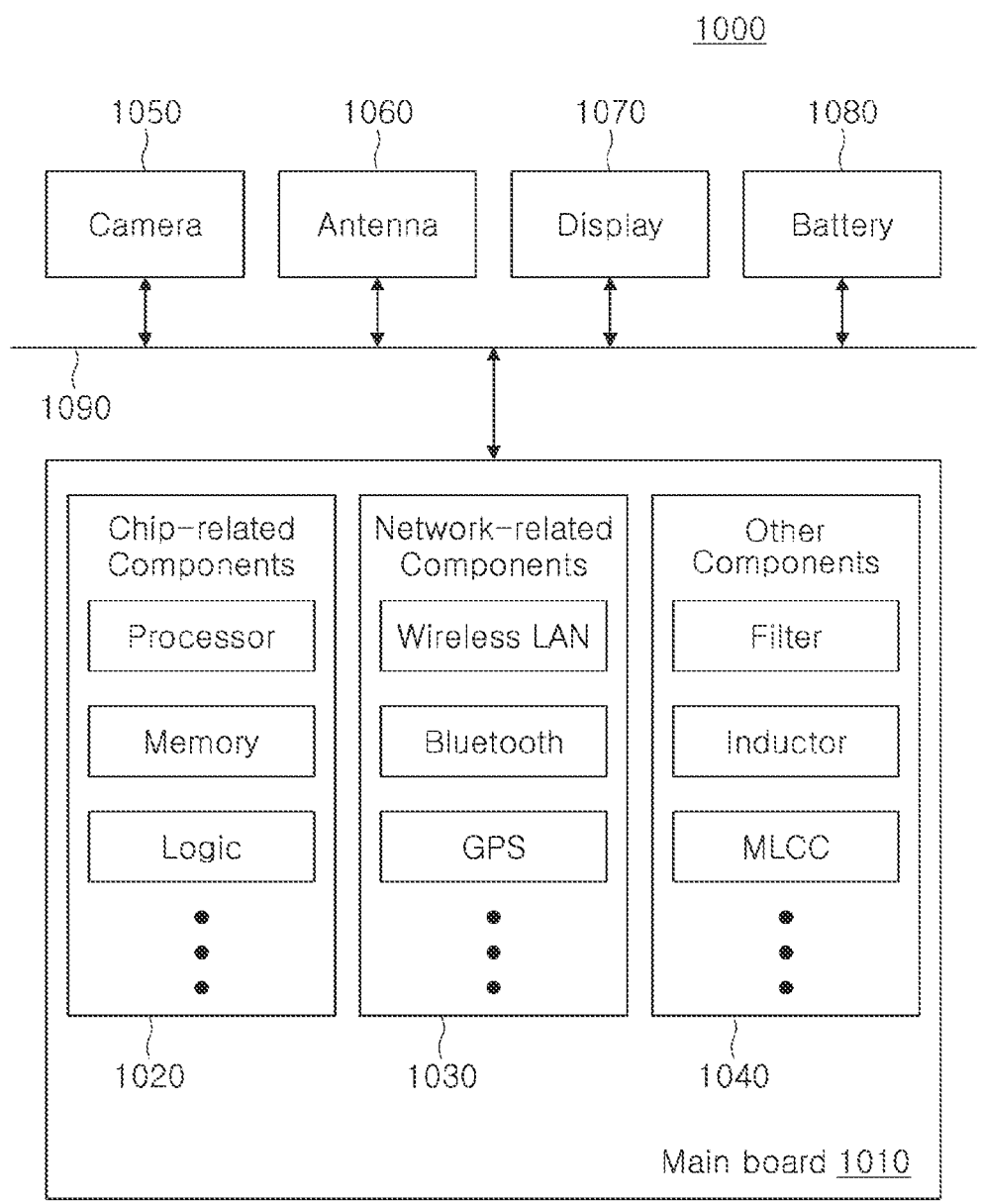
FIG. 1 is a block diagram illustrating an example of an electronic device system.

Hereinafter, example embodiments of the present disclosure will be described with reference to the accompanying drawings. In the drawings, shapes, sizes, and the like, of elements may be exaggerated or briefly illustrated for clarity of description.

FIG. 1 is a block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
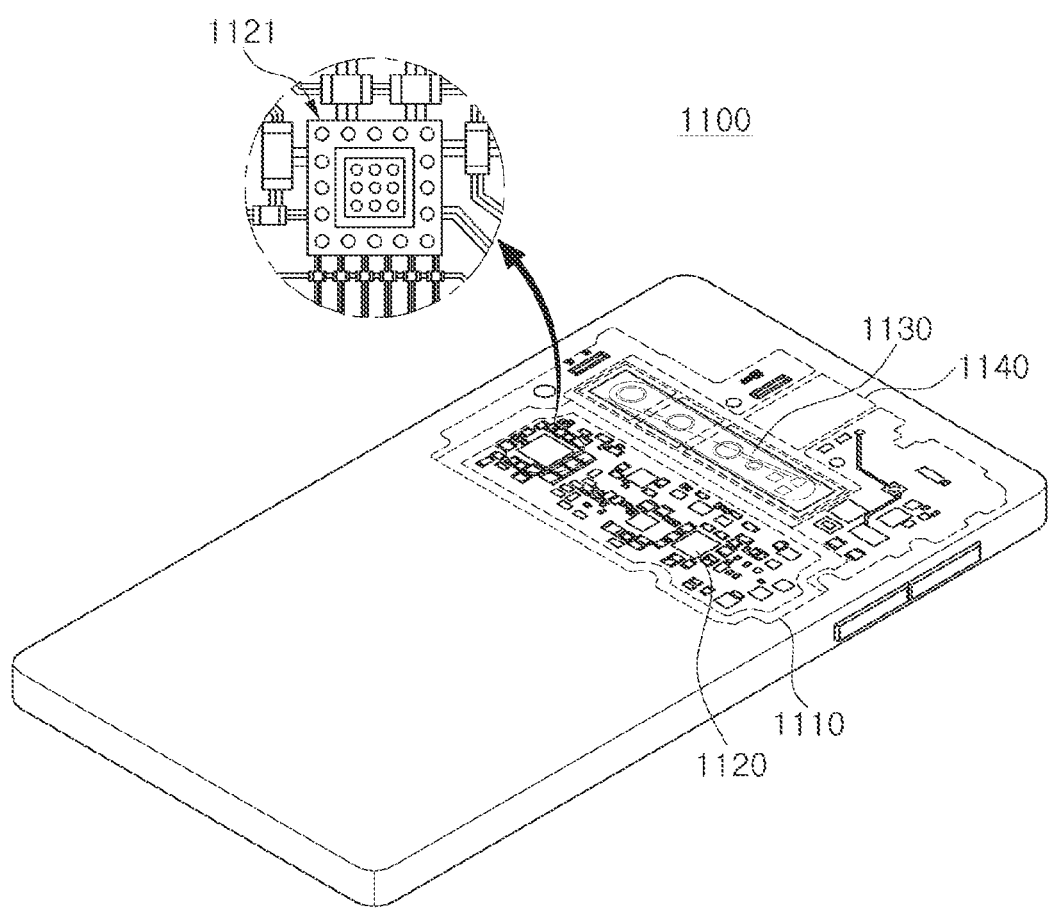
FIG. 2 is a perspective diagram illustrating an example of an electronic device.

FIG. 2 is a perspective diagram illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be the chip related components, a semiconductor package 1121, for example, but are not limited thereto. The electronic device is not necessarily limited to the smartphone 1100, but may be other electronic devices as described above.

Figure 3:
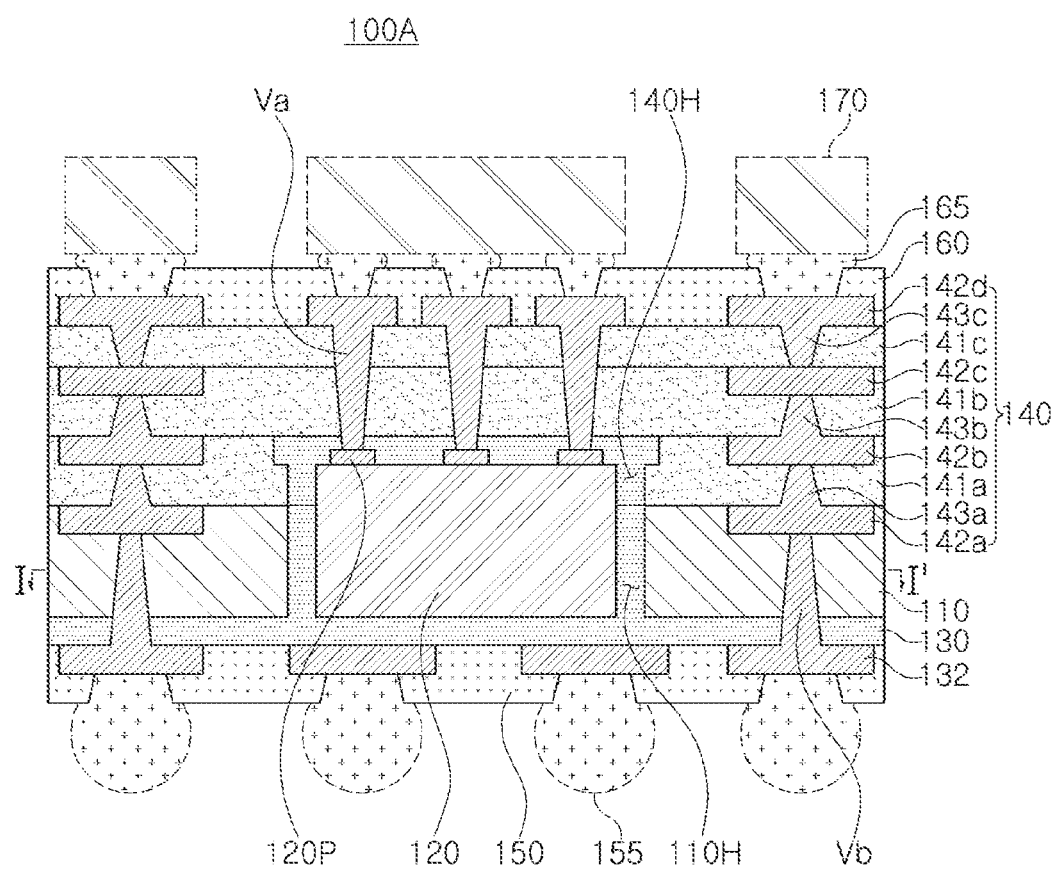
FIG. 3 is a cross-sectional diagram illustrating an example of a substrate with an electronic component embedded therein.

FIG. 3 is a cross-sectional diagram illustrating a substrate with an electronic component embedded therein.

Figure 4:
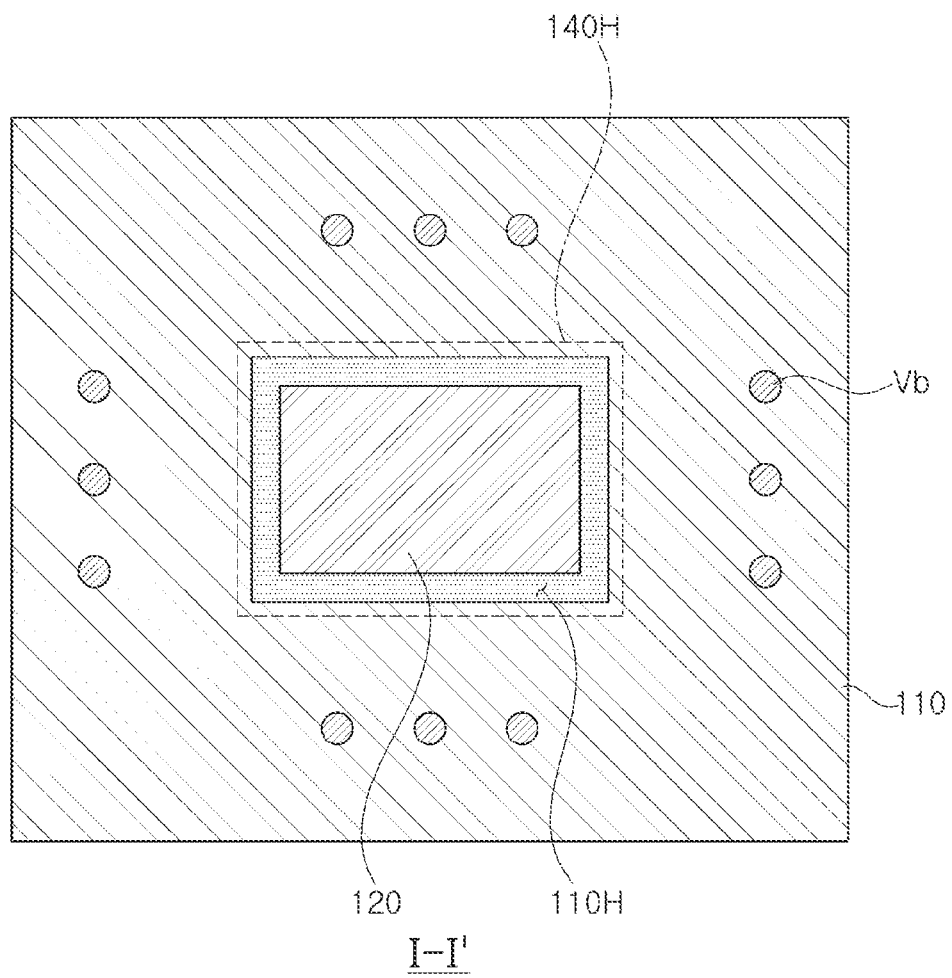
FIG. 4 is a schematic plan diagram illustrating the substrate with the electronic component embedded therein illustrated in FIG. 3 taken along line I-I'.

FIG. 4 is a cross-sectional plan diagram illustrating a substrate with an electronic component embedded therein illustrated in FIG. 3 taken along line I-I' in FIG. 3.

The substrate with the electronic component embedded therein 100A includes a core layer 110 having a through-portion 110H, a build-up structure 140 disposed on an upper surface of the core layer 110 and including a plurality of insulating layers 141a, 141b, and 141c, a plurality of wiring layers 142a, 142b, 142c, and 142d, and a plurality of via layers 143a, 143b, and 143c and having a cavity 140H connected to the through-portion 110H, an electronic component 120 disposed in the through-portion 110H and the cavity 140H, and an encapsulant 130 disposed on a lower surface of the core layer 110, filling at least a portion of each of the through-portion 110H and the cavity 140H and covering at least a portion of a lower surface of the electronic component 120.

For example, as in a process to be described later, the substrate with the electronic component embedded therein 100A according to an example may be manufactured by collectively laminating layers of a laminate, a precursor of the build-up structure 140 having the cavity 140H on a laminate in which the electronic component 120 is attached to the encapsulant 130 in the first through-hole 110H of the core layer 110 by a heating process, or the like. In this case, since the electronic component 120 may be embedded in the encapsulant 130 without a separate adhesive film and a separate metal pattern for a stopper, and the electronic component 120 may be disposed not only in the through-portion 110H but also in the cavity 140H, the substrate with the electronic component embedded therein 100A, advantageous for thinning, may be provided. In addition, by lowering the overall thickness, since a central axis between the upper and lower portions of the substrate may be brought close to the electronic component 120, and also an area ratio occupied in the substrate of the electronic component 120 may be increased, it may be beneficial for warpage improvement.

Meanwhile, the substrate with the electronic component embedded therein 100A according to an example may further include a first wiring via Va connecting at least a portion of a fourth wiring layer 142d among the plurality of wiring layers 142a, 142b, 142c, and 142d to the electronic component 120. The first wiring via Va may penetrate through second and third insulating layers 141b and 14c among the plurality of insulating layers 141a, 141b, and 141c, and may further penetrate through at least a portion of the encapsulant 130 filling a space between the electronic component 120 and the build-up structure 140. That is, since the first wiring via Va may be formed after a laminate is collectively laminated, it may collectively penetrate through the second and third insulating layers 141b and 141c and at least a portion of the encapsulant 130.

Meanwhile, in the substrate with the electronic component embedded therein 100A according to an example, as a result of a process described later, a via of each of the first and second via layers 143a and 143b among the plurality of via layers 143a, 143b, and 143c may have a shape tapered in a direction opposite to a via of a third via layer 143c among the via layers 143a, 143b, and 143c. In this respect, the first wiring via Va may have a shape tapered in the same direction as the third via layer 143c among the plurality of via layers 143a, 143b, and 143c, and may have a shape tapered in a direction opposite to the first and second via layers 143a and 143b. Since the first wiring via Va is formed by collectively penetrating through at least a portion of the encapsulant 130, a height thereof may be greater than the via of each of the plurality of via layers 143a, 143b, and 143c respectively penetrating through the plurality of insulating layers 141a, 141b, and 141c.

Meanwhile, the substrate with the electronic component embedded therein 100A according to an example may further include a backside wiring layer 132 disposed on a lower surface of the encapsulant 130. As described above, in an example, a back surface of the electronic component 120 may be directly attached to the encapsulant 130, and the backside wiring layer 132 may be disposed on the lower surface of the encapsulant 130 without a separate metal pattern for a stopper. Therefore, it is possible to reduce the number of unnecessary layers, and as a result, it is possible to achieve a thinner thickness.

Meanwhile, the substrate electronic component embedded therein 100A according to an example may further include a second wiring via Vb connecting at least a portion of the first wiring layer 142a of the plurality of wiring layers 142a, 142b, 142c, and 142d to the backside wiring layer 132. The second wiring via Vb may penetrate through the core layer 110, and may further penetrate through at least a portion of the encapsulant 130 covering the lower surface of the core layer 110. As described above, in an example, since the second wiring via Vb may be formed after the above-described collective lamination, the core layer 110 and at least a portion of the encapsulant 130 may be collectively penetrated, and the first and second wiring vias Va and Vb may have a shape tapered in opposite directions.

Meanwhile, the substrate with the electronic component embedded therein 100A according to an example may further include a first passivation layer 150 disposed on the lower surface of the encapsulant 130 and having a plurality of first openings respectively exposing at least a portion of the backside wiring layer 132, and/or a second passivation layer 160 disposed on the build-up structure 140 and having a plurality of second openings respectively exposing at least a portion of the fourth wiring layer 142d among the plurality of wiring layers 142a, 142b, 142c, and 142d. Thereby, internal components can be protected from physical and chemical damages.

Meanwhile, the substrate with the electronic component embedded therein 100A according to an example may further include a plurality of first electrical connection metal bumps 155 respectively disposed on the plurality of first openings of the first passivation layer 150 and respectively connected to the exposed backside wiring layer 132, and/or a plurality of second electrical connection metal bumps 165 respectively disposed on the plurality of second openings of the second passivation layer 160 and respectively connected to the exposed fourth wiring layer 142d. The substrate with the electronic component embedded therein 100A may be mounted on another printed circuit board such as a main board or an additional ball grid array (BGA) board through the plurality of first electrical connection metal bumps 155. In addition, the surface mount component 170 may be surface-mounted on the second passivation layer 160 through the plurality of second electrical connection metal bumps 165.

Hereinafter, components of the substrate with the electronic component embedded therein 100A according to an example will be described in more detail with reference to the drawings.

The core layer 110 may further improve the rigidity of the substrate with the electronic component embedded therein 100A according to a specific material, and may perform a role of securing uniformity of the thickness of the encapsulant 130. The core layer 110 has a through-portion 110H penetrating therethrough. The through-portion 110H may be a closed space in which all four sides are blocked, but if necessary, there may be a discontinuous portion, for example, an externally open portion in a partial region. If necessary, there may be a plurality of first through-portions 110H, and the same or different electronic components 120 may be disposed in each of them. The thickness of the core layer 110 may be thicker than the thickness of each of the plurality of insulating layers 141a, 141b, and 141c. The thickness of the core layer 110 may be thinner than that of the electronic component 120. As a material of the core layer 110, an insulating material may be used. As an insulating material, a thermosetting resin such as an epoxy resin, or a thermoplastic resin such as a polyimide resin may be used. In addition, an insulating material in which an inorganic filler such as silica and a reinforcing material such as glass fiber are contained in these resins, may be used. For example, prepreg may be used as the material of the core layer 110, but is not limited thereto. As the insulating material, a thermosetting resin such as an epoxy resin or a thermoplastic resin such as polyimide may be used. Further, those resins containing inorganic fillers such as silica and reinforcing materials such as glass fibers may be used. For example, a prepreg may be used, but is not limited thereto.

The electronic component 120 may be an integrated circuit (IC) in which hundreds to millions of elements are integrated in a single chip. For example, the electronic component 120 may be a processor chip such as a central processor (e.g., CPU), a graphic processor (e.g., GPU), a field programmable gate array (FPGA), a digital signal processor, an encryption processor, a microprocessor, a microcontroller, or the like, specifically, an application processor (AP), but is not limited thereto, and may be a memory such as a volatile memory (e.g., DRAM), a non-volatile memory (e.g., ROM), a flash memory, or the like, an analog-digital converter, or a logic such as an application-specific IC (ASIC), or the like. If necessary, the electronic component 120 may be a chip-type passive component, for example, a chip-type inductor, a chip-type capacitor, or the like. The electronic component 120 may be disposed such that a surface on which a connection pad 120P is disposed faces upward, and a side opposite the side thereof faces downward. The connection pad 120P of the electronic component 120 may include a metal material such as copper (Cu) or aluminum (Al), and may be connected to the first wiring via Va. The electronic component 120 may be directly attached to the encapsulant 130 without a separate adhesive film, and as a result, the back surface may physically contact the encapsulant 130.

The encapsulant 130 may be disposed on a lower surface of the core layer 110 to cover the lower surfaces of the core layer 110 and the electronic component 120. In addition, the encapsulant 130 may fill at least a portion of each of the through-portion 110H and the cavity 140H, and as a result, the encapsulant 130 may also cover at least a portion of each of an upper surface and a side surface of the electronic component 120. For example, the encapsulant 130 may physically contact at least a portion of each of the upper surface, the lower surface, and the side surface of the electronic component 120. An insulating material may be used as the material of the encapsulant 130, and a thermosetting resin such as an epoxy resin or a thermoplastic resin such as polyimide may be used as the insulating material. In addition, those resins containing inorganic fillers such as silica may be used. For example, an Ajinomoto Build-up Film (ABF) may be used as the material of the encapsulant 130. The ABF may be provided in the form of Resin Coated Copper (RCC), but is not limited thereto. If necessary, a photosensitive material such as PIE (Photo Image-able Dielectric) may be used.

The backside wiring layer 132 may be disposed on the lower surface of the encapsulant 130. As the backside wiring layer 132, a metal material may be used, and as the metal material, copper (Cu), aluminum (Al), silver (Ag), tin (Sn), gold (Au), nickel (Ni), lead (Pb), titanium (Ti), or alloys thereof may be used. The backside wiring layer 132 may perform various functions according to the design of the corresponding layer. For example, the backside wiring layer 132 may include a ground pattern, a power pattern, a signal pattern, or the like. Each of the patterns may have a line, a plane, and/or a pad shape. The backside wiring layer 132 may be formed by a plating process such as an additive process (AP), a semi AP (SAP), a modified SAP (MSAP), tenting (TT), and the like, and as a result, may include a seed layer, an electroless plating layer, and an electrolytic plating layer formed based on the seed layer. When the encapsulant 130 is provided in the form of an RCC, the backside wiring layer 132 may further include a metal foil such as copper foil, and if necessary, a primer resin may also be provided on the surface of the metal foil.

The build-up structure 140 may provide various wiring paths to the substrate with the electronic component embedded therein 100A. The build-up structure 140 may be disposed on the upper surface of the core layer 110. The build-up structure 140 includes a plurality of insulating layers 141*a*, 141*b*, and 141*c*, a plurality of wiring layers 142*a*, 142*b*, 142*c*, and 142*d*, and a plurality of via layers 143*a*, 143*b*, and 143*c*. In addition, the build-up structure 140 has a cavity 140H penetrating through the first insulating layer 141*a* among the plurality of insulating layers 141*a*, 141*b*, and 141*c*. If necessary, the cavity 140H may further also penetrate through the second insulating layer 141*b* among the plurality of insulating layers 141*a*, 141*b*, and 141*c*. The cavity 140H may be a closed space in which all four side portions are blocked, but if necessary, there may be a discontinuous portion, for example, an externally open portion in a partial region. The cavity 140H may be connected to the through-portion 110H. Therefore, when a plurality of through-portions 110H are present, a plurality of cavities 140H may also be present. The side portion of the cavity 140H may have a step. For example, the cavity 140H may include a plurality of regions having different areas.

The plurality of insulating layers 141*a*, 141*b*, and 141*c* includes a first insulating layer 141*a*, a second insulating layer 141*b*, and a third insulating layer 141*c*, sequentially laminated. As a material of the plurality of insulating layers 141*a*, 141*b*, and 141*c*, an insulating material may be used. As the insulating material, a thermosetting resin such as an epoxy resin, or a thermoplastic resin such as a polyimide resin may also be used. In addition, an insulating material in which an inorganic filler such as silica is contained in these resins may also be used. For example, prepreg may be used as a material for the plurality of insulating layers 141*a*, 141*b*, 141*c*, but is not limited thereto, and a material not including a reinforcing material such as glass fiber, for example, ABF, or the like be used. If necessary, a photosensitive insulating material such as Photo Image-able Dielectric (PID) may be used.

The plurality of wiring layers 142*a*, 142*b*, and 142*c* includes a first wiring layer 142*a* disposed on a lower surface of the first insulating layer 141*a*, a second wiring layer 142*b* disposed on a lower surface of the second insulating layer 141*b* and embedded in the first insulating layer 141*a*, a third wiring layer 142*c* disposed on a lower surface of the third insulating layer 141*c* and embedded in the second insulating layer 141*b*, and a fourth wiring layer 142*d* disposed on an upper surface of the third insulating layer 141*c*. In this case, the third wiring layer 142*c* and the fourth wiring layer 142*d* may be disposed on opposing surfaces of the third insulating layer 141*c*, and each of the third wiring layer 142*c* and the fourth wiring layer 142*d* may protrude from a respective surface of the third insulating layer 141*c*. As a material of the plurality of wiring layers 142*a*, 142*b*, 142*c*, and 142*d*, a metal material may be used, and as the metal material, copper (Cu), aluminum (Al), silver (Ag), tin (Sn), gold (Au), nickel (Ni), lead (Pb), titanium (Ti), or alloys thereof may be used. The plurality of wiring layers 142*a*, 142*b*, 142*c*, and 142*d* may perform various functions according to the design of the corresponding layer. For example, the plurality of wiring layers 142*a*, 142*b*, 142*c*, and 142*d* may include a ground pattern, a power pattern, a signal pattern, or the like. Each of the patterns may have a line, a plane, and/or a pad shape. The plurality of wiring layers 142*a*, 142*b*, 142*c*, and 142*d* may be formed by a plating process such as an additive process (AP), a semi AP (SAP), a modified SAP (MSAP), tenting (TT), and the like, and as a result, may include a seed layer, an electroless plating layer, and an electrolytic plating layer formed based on the seed layer. When the plurality of wiring layers 142*a*, 142*b*, 142*c*, and 142*d* are provided in the form of an RCC, the plurality of wiring layers 142*a*, 142*b*, 142*c*, and 142*d* may further include a metal foil such as copper foil, and if necessary, a primer resin may also be provided on the surface of the metal foil.

The plurality of via layers 143*a*, 143*b*, and 143*c* includes a first via layer 143*a* penetrating through the first insulating layer 141*a* and electrically connecting the first and second wiring layers 142*a* and 142*b*, a second via layer 143*b* penetrating through the second insulating layer 141*b* and electrically connecting the second and third wiring layers 142*b* and 142*c*, and a third via layer 143*c* penetrating through the third insulating layer 141*c* and electrically connecting the third and fourth wiring layers 142*c* and 142*d*. As a material of the plurality of via layers 143*a*, 143*b*, and 143*c*, a metal material may be used, and as the metal material, copper (Cu), aluminum (Al), silver (Ag), tin (Sn), gold (Au), nickel (Ni), lead (Pb), titanium (Ti), or alloys thereof may be used. The plurality of via layers 143*a*, 143*b*, and 143*c* may include a connection via for signal connection, a connection via for ground connection, and a connection via for power connection, and the like according to designs. The via of each of the plurality of via layers 143a, 143b, and 143c may be those in which via holes are completely filled with a metal material, or a metal material may also be formed along wall surfaces of the via holes. The plurality of via layers 143a, 143b, and 143c may also be formed by a plating process, for example, AP, SAP, MSAP, TT, or the like, and may include a seed layer, an electroless plating layer, and an electrolytic plating layer formed based on the seed layer. The via of each of the first and second via layers 143a and 143b may have a shape tapered in which the width of the lower surface is greater than the width of the upper surface, and the via of the third via layer 143c may have a shape tapered in which the width of the upper surface is greater than the width of the lower surface.

The first wiring via Va collectively penetrates through the second and third insulating layers 141b and 141c and at least a portion of the encapsulant 130. The first wiring via Va may electrically connect the fourth wiring layer 142d and the connection pad 120P to each other. A plurality of first wiring vias Va may be provided. As a material of the first wiring via Va, a metal material may be used, and as the metal material, copper (Cu), aluminum (Al), silver (Ag), tin (Sn), gold (Au), nickel (Ni), lead (Pb), titanium (Ti), or alloys thereof may be used. The first wiring via Va may include a connection via for signal connection, a connection via for ground connection, and a connection via for power connection, and the like according to designs. The first wiring via Va may be a via in which via holes are completely filled with a metal material, respectively, or a metal material may also be formed along wall surfaces of the via holes. The first wiring via Va may also be formed by a plating process, for example, AP, SAP, MSAP, TT, or the like, and may include a seed layer, an electroless plating layer, and an electrolytic plating layer formed based on the seed layer. The first wiring via Va may have a shape tapered in which the width of the upper surface is greater than the width of the lower surface.

The second wiring via Vb collectively penetrates through the core layer 110 and at least a portion of the encapsulant 130. The second wiring via Vb may electrically connect the first wiring layer 142a and the backside wiring layer 132 to each other. A plurality of second wiring vias Vb may be provided. As a material of the second wiring via Vb, a metal material may be used, and as the metal material, copper (Cu), aluminum (Al), silver (Ag), tin (Sn), gold (Au), nickel (Ni), lead (Pb), titanium (Ti), or alloys thereof may be used. The second wiring via Vb may include a connection via for signal connection, a connection via for ground connection, and a connection via for power connection, and the like according to designs. The second wiring via Vb may be a via in which via holes are completely filled with a metal material, respectively, or a metal material may also be formed along wall surfaces of the via holes. The second wiring via Vb may also be formed by a plating process, for example, AP, SAP, MSAP, TT, or the like, and may include a seed layer, an electroless plating layer, and an electrolytic plating layer formed based on the seed layer. The second wiring via Vb may have a shape tapered in which the width of the lower surface is greater than the width of the upper surface.

First and second passivation layers 150 and 160 may protect an internal configuration from external physical and chemical damages, or the like. The first and second passivation layers 150 and 160 may have a plurality of first and second openings, respectively. The plurality of first openings 151 may expose at least a portion of the backside wiring layer 132, respectively. The plurality of second openings may expose at least a portion of the fourth wiring layer 142d, respectively. A material of the first and second passivation layers 150 and 160 may include an insulating material. In this case, as the insulating material, a thermosetting resin such as an epoxy resin, a thermoplastic resin such as a polyimide resin, a material in which the thermosetting resin or the thermoplastic resin are mixed with an inorganic filler, for example, ABF may be used, but is not limited thereto.

A plurality of first and second electrical connection metal bumps 155 and 165 are disposed on the plurality of first and second openings of the first and second passivation layers 150 and 160, respectively. The plurality of first electrical connection metal bumps 155 may be electrically connected to the exposed backside wiring layer 132, respectively. The plurality of second electrical connection metal bumps 155 may be electrically connected to the exposed fourth wiring layer 142d, respectively. The plurality of first electrical connection metal bumps 155 may physically and/or electrically connect a substrate with an electronic component embedded therein 100A to an external entity. For example, the substrate having the electronic component embedded therein 100A may be mounted on a mainboard of an electronic device, a ball grid array (BGA), or the like, through the plurality of first electrical connection metal bumps 155. The plurality of second electrical connection metal bumps 165 may physically and/or electrically connect a substrate with an electronic component embedded therein 100A to a component 170 surface-mounted thereon. The plurality of first and second electrical connection metal bumps 155 and 165 may be formed of tin (Sn), or an alloy containing tin (Sn), for example, a solder, but this is merely an example, and the material is not particularly limited thereto. The plurality of first and second electrical connection metal bumps 155 and 165 may be configured as a land, a ball, a pin, or the like, respectively.

Each of the surface mounted components 170 may be an active component and/or a passive component. Examples of the active component may include the IC described above for the electronic component 120. Examples of passive components may include chip-type capacitors such as a multi-layer ceramic capacitor (MLCC), and a chip-type inductors such as a power inductor (PI). If necessary, a molding material covering the surface-mounted component 170 may be further disposed on the second passivation layer 160, and the molding material may be a known Epoxy Molding Compound (EMC), but is not limited thereto. When the surface mount component 170 is further disposed, the substrate with the electronic component embedded therein 100A may be used as a package module, for example, a System in Package (SiP).

FIGS. 5 to 9 are process cross-sectional views schematically illustrating an example of manufacturing a substrate with an electronic component embedded therein of FIG. 3.

Figure 5:
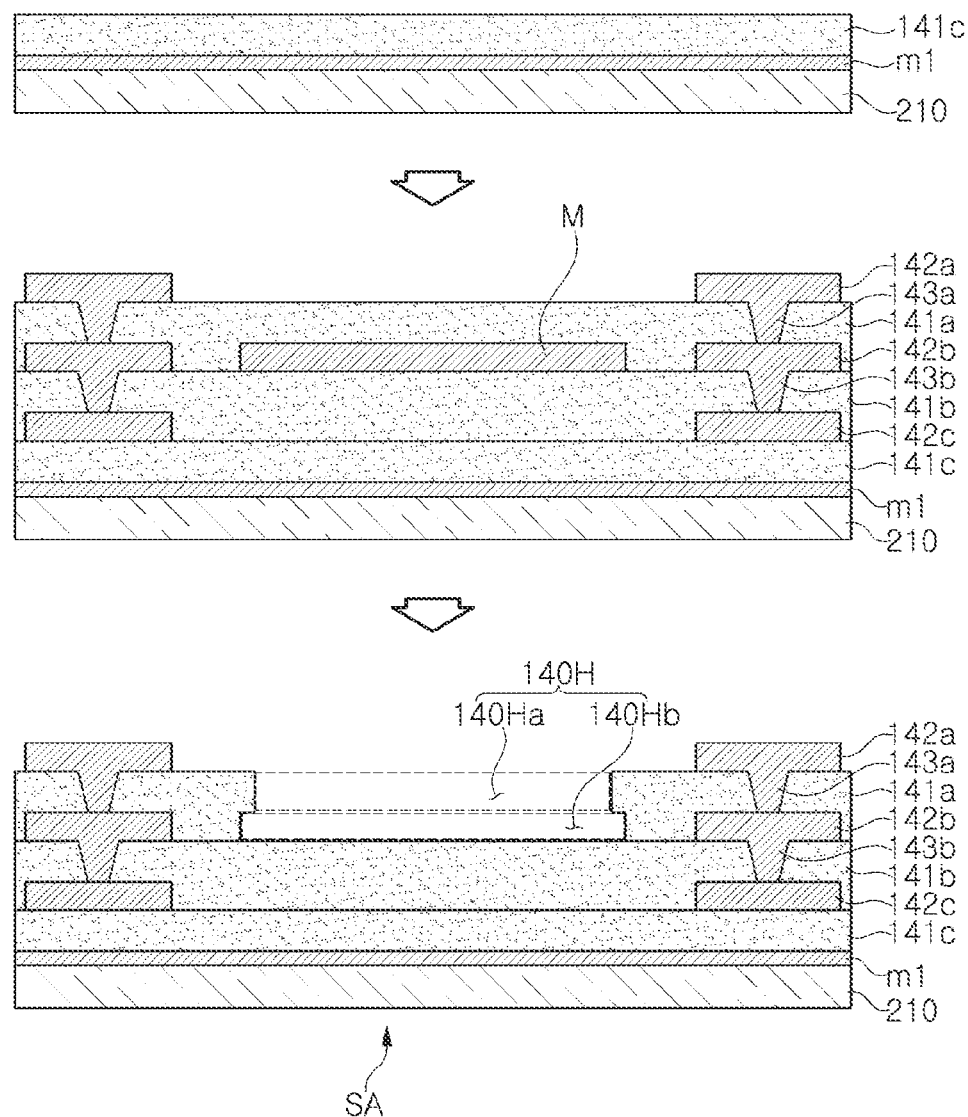
FIGS. 5 to 9 are cross-sectional views schematically illustrating an example of manufacturing the substrate with the electronic component embedded therein of FIG. 3.

Referring to FIG. 5, first, a carrier 210 in which a metal foil m1 is prepared on at least one surface. Thereafter, a third insulating layer 141c is formed on the metal foil m1. Next, a third wiring layer 142c is formed on the third insulating layer 141c by a plating process, a second insulating layer 141b embedding the third wiring layer 142c is formed on the third insulating layer 141c, and after a via hole is processed by laser drilling, or the like, a second wiring layer 142b and a third via layer 143b are formed by a plating process. In this process, a metal pattern M is also formed on the second insulating layer 141b. In addition, a first insulating layer 141 embedding the second wiring layer 142b and the metal pattern M is formed on the second insulating layer 141b, and after a via hole is processed by laser drilling, or the like, a first wiring layer 142a and a first via layer 143a are formed by a plating process. Next, a first region 140Ha of the cavity 140H is formed by blast processing, and in addition, a second region 140Hb of the cavity 140H is formed by removing the metal pattern M by an etching process. That is, in this process, the cavity 140H may include a first region 140Ha having a first planar area on a plane and a second region 140Hb having a second planar area, greater than the first planar area on the plane. The first region 140Ha of the cavity 140H may be connected to the through-portion 110H as in a process to be described later. Through a series of processes, a first precursor SA for the build-up structure 140 may be manufactured.

Figure 6:
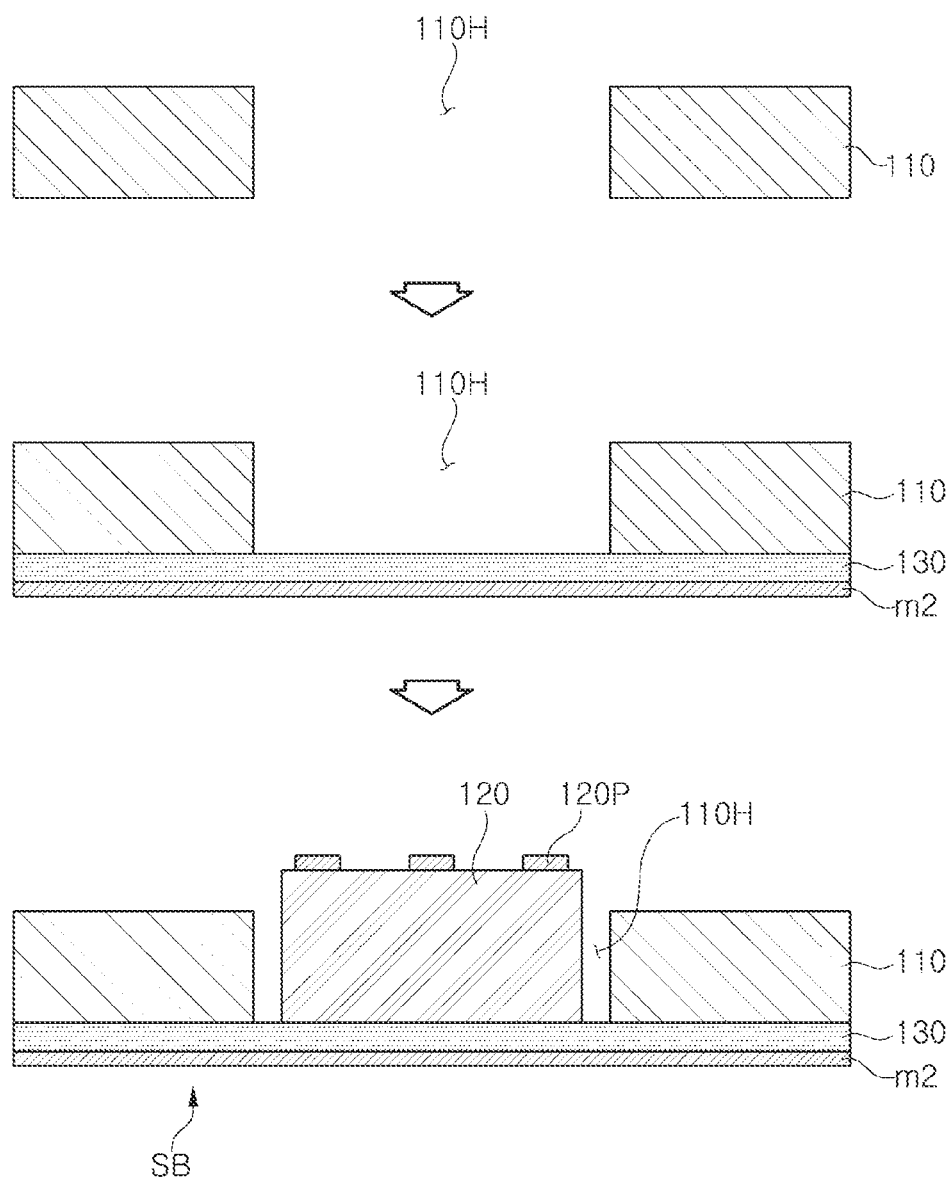

Referring to FIG. 6, first, a core layer 110 is prepared, and a through-portion 110H penetrating through the core layer 110 is formed by laser processing, mechanical processing, or the like. Next, an encapsulant 130 having a metal foil m2 is attached to the lower surface of the core layer 110. The encapsulant 130 may be a thermosetting material in an uncured state, and may be temporarily contacted with the core layer 110. Next, the electronic component 120 is attached to the encapsulant 130 in the through-portion 110H. A heating process may be used to attach the electronic component 120. Viscosity may be imparted such that the viscosity of the uncured encapsulant 130 becomes the lowest viscosity during the heating process. The encapsulant 130 may be adhered to the back surface of the electronic component 120 by a heating process. Through a series of processes, a second precursor SB including the core layer 110 may be manufactured.

Figure 7:
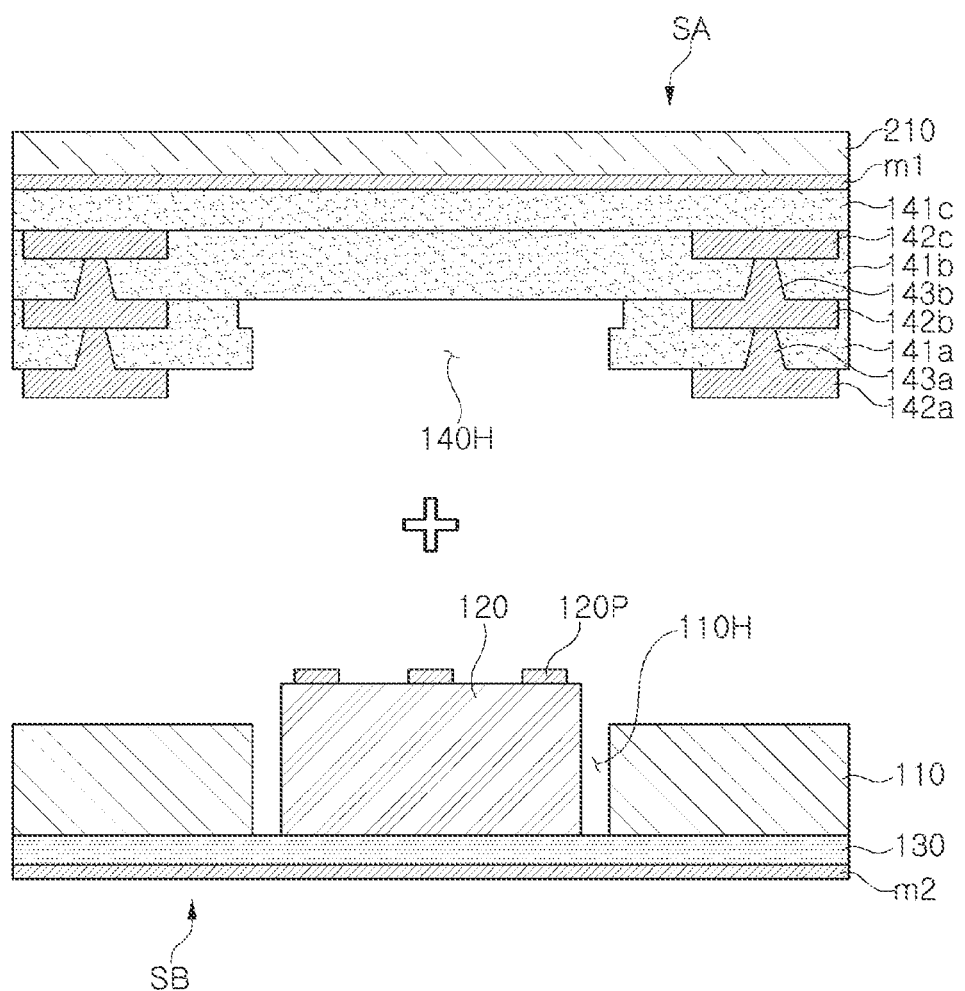

Referring to FIG. 7, the first precursor SA and the second precursor SB are collectively laminated. In this case, the encapsulant 130 may fill the first through-portion 110H and the cavity 140H. If necessary, a heating process may be additionally performed in order to increase the fluidity of the encapsulant 130 during the lamination process. After lamination, the uncured or semi-cured materials can be cured by heating, or the like. Next, the carrier 210 is removed from the laminate, a via hole is formed in the laminate by laser processing, and the fourth wiring layer 142d and the backside wiring layer 132 and the third via layer 143c, and the first and second wiring vias Va and Vb are formed. In addition, first and second passivation layers 150 and 160 are further formed as necessary. The substrate with the electronic component embedded therein 100A according to the above-described example may be manufactured through a series of processes, and other overlapping contents thereof are omitted.

Figure 8:
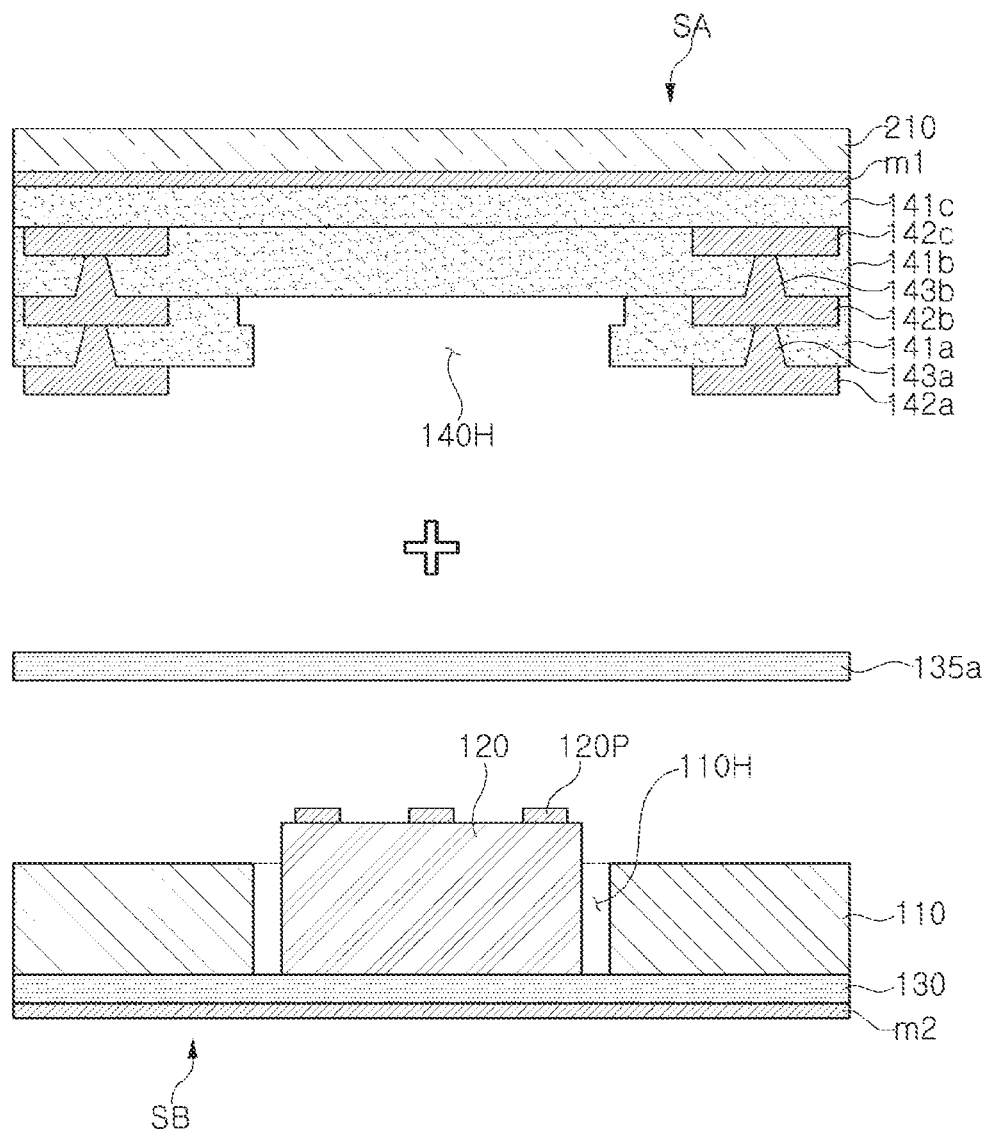
Figure 9:
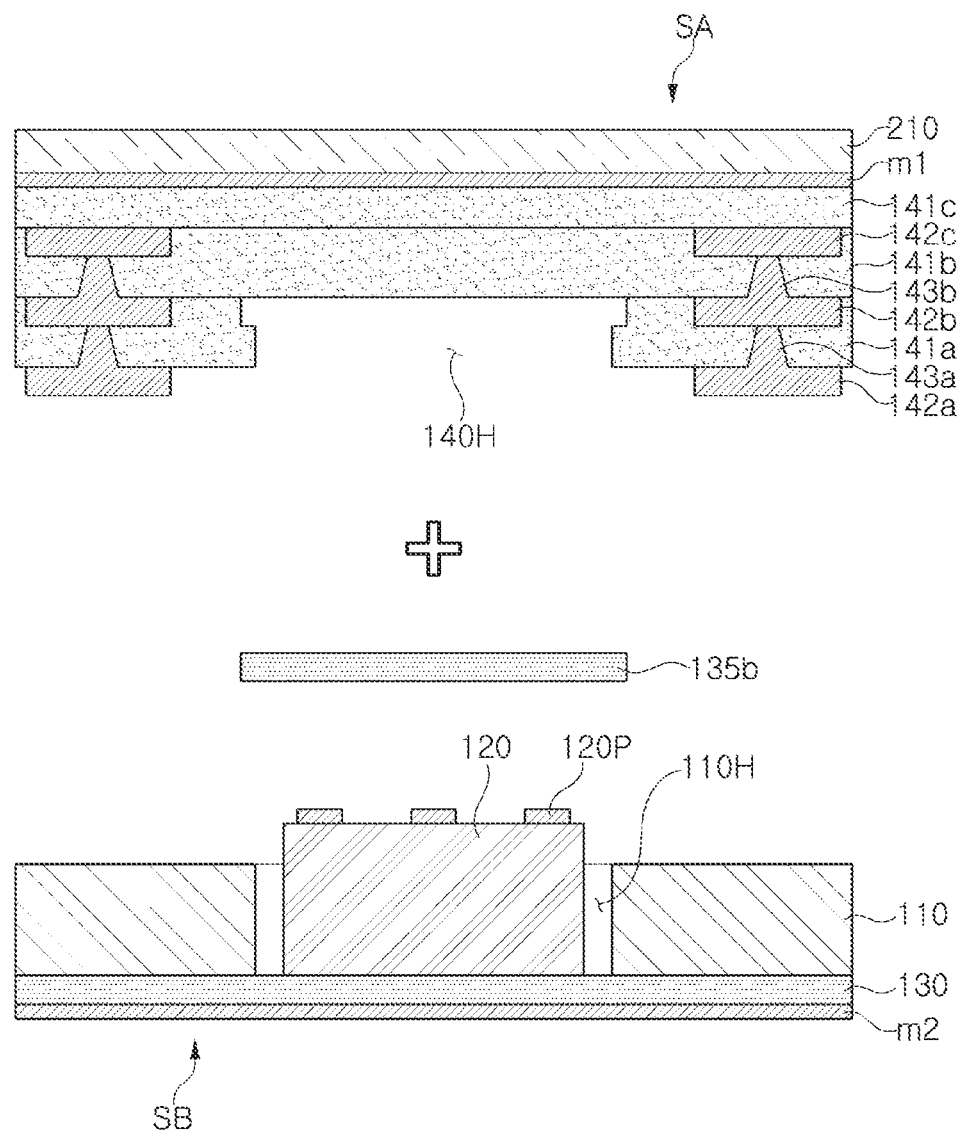

Meanwhile, referring to FIGS. 8 and 9, auxiliary encapsulants 135a and 135b may be introduced into a collective lamination process to secure the filling properties of the through-portion 110H and the second through-portion 140H, if necessary. The auxiliary encapsulants 135a and 135b may fill at least a portion of each of the through-portion 110H and the cavity 140H.
That is, the encapsulant 130 may consequently be composed of multiple layers. The auxiliary encapsulants 135a and 135b may include the same material as the encapsulant 130, or may include a different type of a non-conductive film (NCF). The sizes of the auxiliary sutures 135a and 135b may vary as shown in the drawings.

Figure 10:
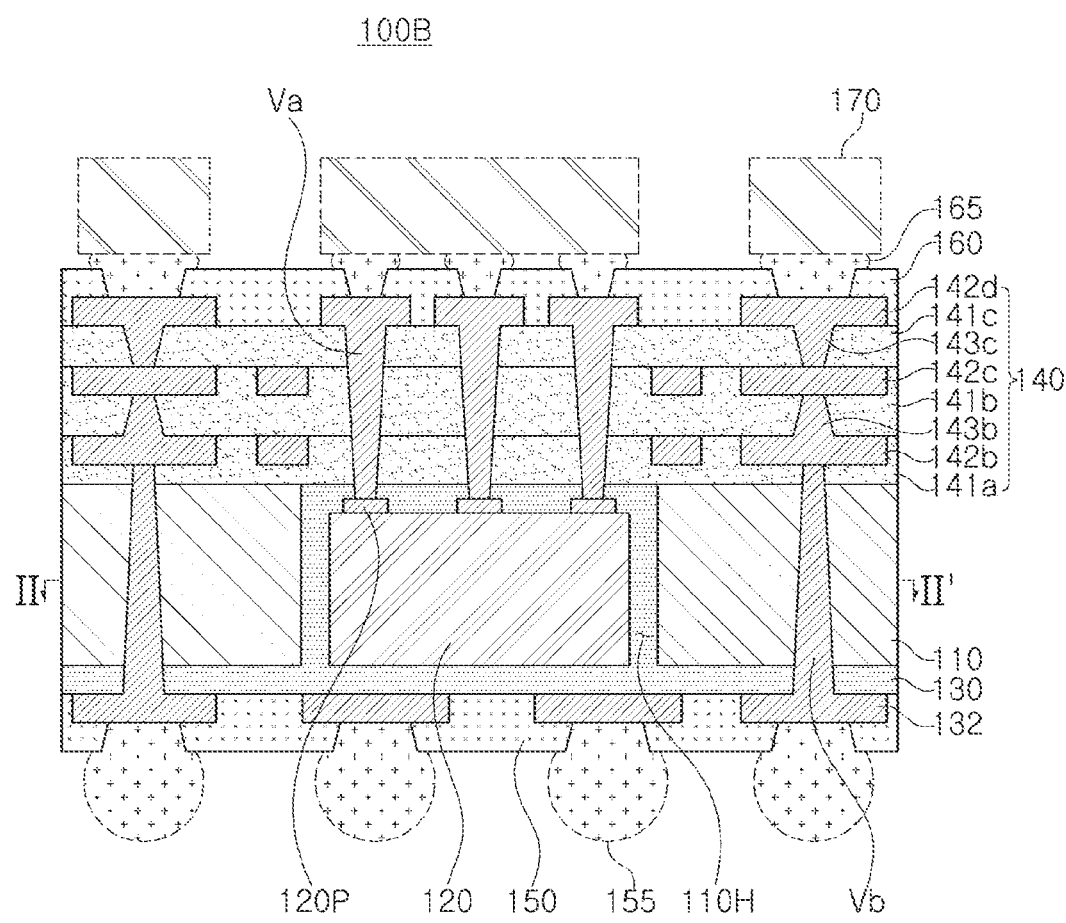
FIG. 10 is a cross-sectional view schematically illustrating another example of a substrate with an electronic component embedded therein.

FIG. 10 is a schematic cross-sectional view illustrating another example in a substrate with the electronic component embedded therein.

Figure 11:
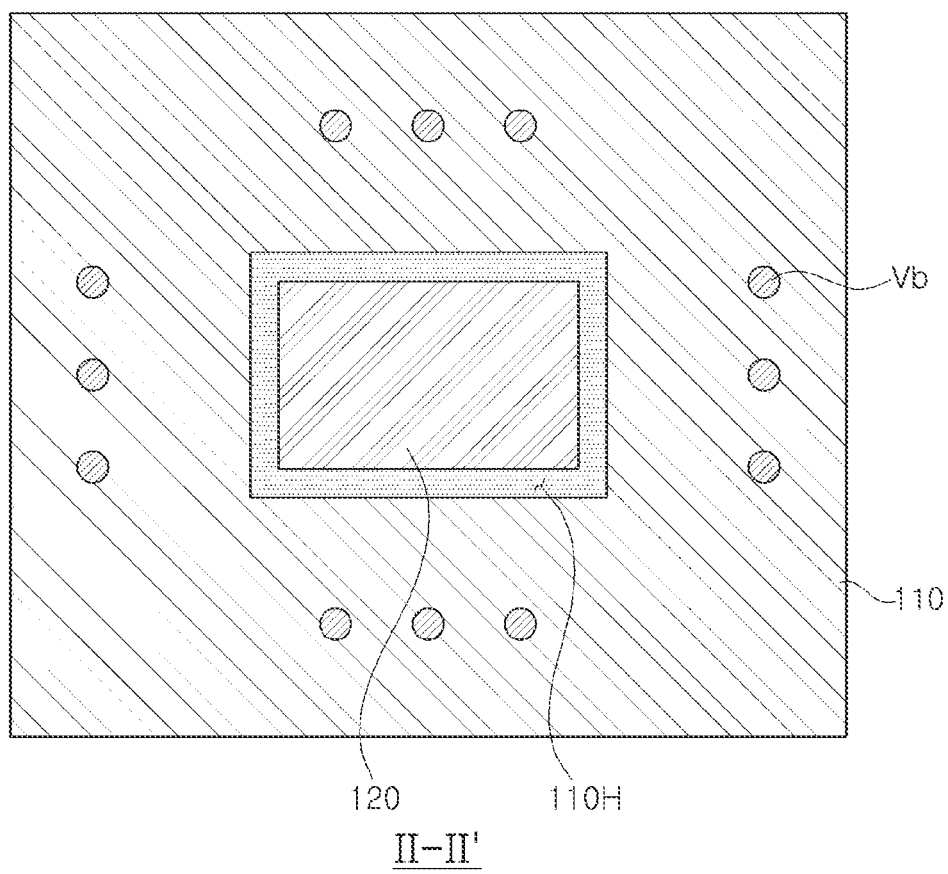
FIG. 11 is a schematic plan diagram illustrating the substrate with the electronic component embedded therein illustrated in FIG. 10 taken along line II-II'.

FIG. 11 is a schematic plan diagram illustrating the substrate with the electronic component embedded therein illustrated in FIG. 10 taken along line II-II'.

Referring to the drawings, in a substrate with an electronic component embedded therein 100B according to another example, compared to the substrate with the electronic component embedded therein 100A according to the above-described example, a build-up structure 140 does not have a cavity 140H, and a first wiring layer 142a and a first via layer 143a are omitted. In this case, the thickness of the core layer 110 may be greater than the thickness of the electronic component 120. That is, since the electronic component 120 may be sufficiently disposed in the through-portion 110H, a separate through-portion or a separate cavity may not be formed in the build-up structure 140, and thus a process may be simplified.

Specifically, the substrate with the electronic component embedded therein 100B according to another example includes: a core layer 110 having a through-portion 110H, a build-up structure 140 disposed on an upper surface of the core layer 110 and including a plurality of insulating layers 141a, 141b, and 141c, a plurality of wiring layers 142b, 142c, and 142d, and a plurality of via layers 143b and 143c, an electronic component 120 disposed in the through-portion 110H, and an encapsulant 130 disposed on a lower surface of the core layer 110, filling at least a portion of the through-portion 110H, and covering at least a portion of a lower surface of the electronic component 120.

For example, as in a process to be described later, the substrate with the electronic component embedded therein 100B according to another example may be manufactured by collectively laminating a laminate, a precursor of the build-up structure 140 on a laminate in which the electronic component 120 is attached to the encapsulant 130 in the first through-hole 110H of the core layer 110 by a heating process, or the like. In this case, since the electronic component 120 is embedded in the encapsulant 130 without a separate adhesive film and a separate metal pattern for a stopper, a substrate with an electronic component embedded therein 100B having an asymmetric shape can be provided, advantageous for thinning. In addition, by lowering the overall thickness, a central axis between the upper and lower portions of the substrate may be brought close to the electronic component 120, and in addition, since an area ratio occupied in the substrate of the electronic component 120 may be increased, it may be advantageous to improve warpage.

Meanwhile, the substrate with the electronic component embedded therein 100B according to another example may further include a first wiring via Va connecting at least a portion of a fourth wiring layer 142b among the plurality of wiring layers 142b, 142c, and 142d to the electronic component 120. The first wiring via Va may penetrate through all of the plurality of insulating layers 141a, 141b, and 141c, and may further penetrate through at least a portion of the encapsulant 130 filling a space between the electronic component 120 and the build-up structure 140. That is, since the first wiring via Va may be formed after collectively laminating layers of the laminate, the first wiring via Va may collectively penetrate through the plurality of insulating layers 141a, 141b, and 141c and at least a portion of the encapsulant 130.

Meanwhile, in the substrate with the electronic component embedded therein 100B according to another example, as a result of a process to be described later, a via of the second via layer 143b, among the plurality of via layers 143b and 143c, and a via of the third via layer 143c, among the plurality of via layers 143*b* and 143*c*, may have a shape tapered in opposite directions. In this regard, the first wiring via Va may have a shape tapered in the same direction as the third via layer 143*c* among the plurality of via layers 143*b* and 143*c*, and may have a shape tapered in the opposite direction from the second via layer 143*b*. Since the first wiring via Va is formed by collectively penetrating through the plurality of insulating layers 141*a*, 141*b*, and 141*c* and at least a portion of the encapsulant 130, a height thereof may be greater than a via of each of the plurality of via layers 143*b* and 143*c*.

Meanwhile, the substrate with the electronic component embedded therein 100B according to another example may further include a backside wiring layer 132 disposed on the lower surface of the encapsulant 130. As described above, a back surface of the electronic component 120 may be directly attached to the encapsulant 130, and the backside wiring layer 132 may be disposed on a lower surface of the encapsulant 130 without a separate metal pattern for a stopper. Therefore, since it is possible to reduce the number of unnecessary layers, it may be further thinned.

Meanwhile, the substrate with the electronic component embedded therein 100B according to another example may further include a second wiring via Vb connecting at least a portion of a second wiring layer 142*b* among the plurality of wiring layers 142*b*, 142*c*, and 142*d* to the backside wiring layer 132. The second wiring via Vb may penetrate through a core layer 110, and may further penetrate through at least a portion of the encapsulant 130 covering a lower surface of the core layer 110 and a first insulating layer 141*a* among the plurality of insulating layers 141*a*, 141*b*, and 141*c*. As described above, since the second wiring via Vb may be formed after the above-described collective lamination, the core layer 110, at least a portion of the encapsulant 130, and the first insulating layer 141*a* may be collectively penetrated. In addition, the first and second wiring vias Va and Vb may have a shape tapered in opposite directions.

Meanwhile, the substrate with the electronic component embedded therein 100B according to another example may further include: a first passivation layer 150 disposed on the lower surface of the encapsulant 130 and having a plurality of first openings respectively exposing at least a portion of a backside wiring layer 132, and/or a second passivation layer 160 disposed on the build-up structure 140 and having a plurality of second openings respectively exposing at least portions of a fourth wiring layer 142*d* of the plurality of wiring layers 142*b*, 142*c*, and 142*d*. Thereby, internal components may be protected from physical and chemical damages.

Meanwhile, the substrate with the electronic component embedded therein 100B according to another example may further include: a plurality of first electrical connection metal bumps 155 respectively disposed on the plurality of first openings of the first passivation layer 150 and respectively connected to the exposed backside wiring layer 132, and/or a plurality of second electrical connection metal bumps 165 respectively disposed on the plurality of second openings of the second passivation layer 160 and respectively connected to the exposed fourth wiring layer 142*d*. The substrate with the electronic component embedded therein 100B may be mounted on another printed circuit board such as a main board or an additional BGA board through the plurality of first electrical connection metal bumps 155. In addition, a surface-mounted component 170 may be surface-mounted on the second passivation layer 160 through the plurality of second electrical connection metal bumps 165.

Other contents are substantially the same as described above, and overlapping contents thereof will be omitted.

FIGS. 12 to 16 are cross-sectional views schematically illustrating an example of manufacturing the substrate with the electronic component embedded therein of FIG. 10.

Figure 12:
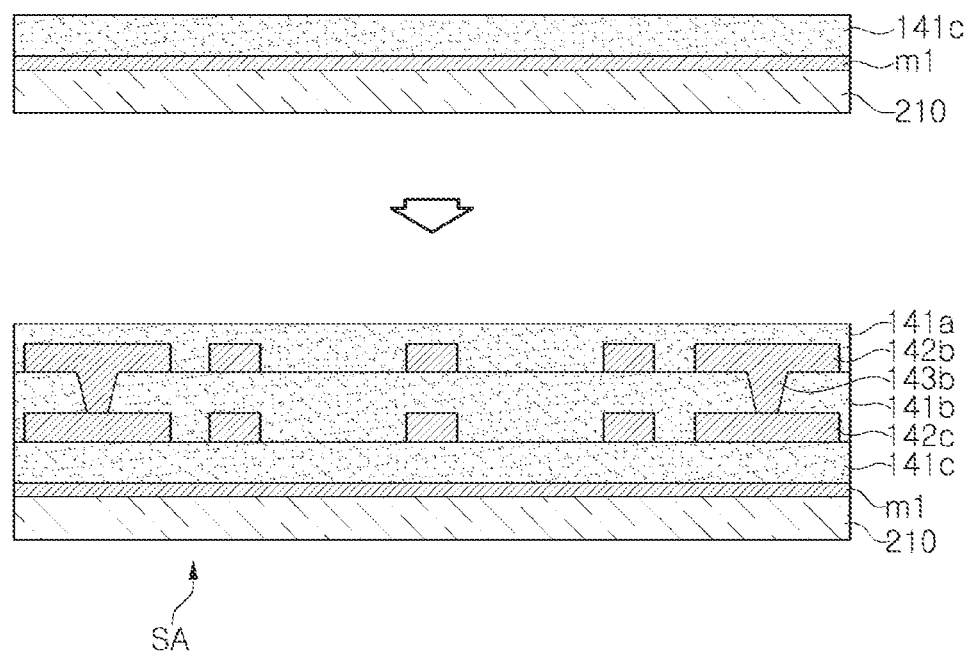
FIGS. 12 to 16 are process cross-sectional views schematically illustrating an example of manufacturing the substrate with the electronic component embedded therein of FIG. 10.

Referring to FIG. 12, first, a carrier 210 in which a metal foil m1 is disposed on at least one surface is prepared. Thereafter, a third insulating layer 141*c* is formed on the metal foil m1. Next, a third wiring layer 142*c* is formed on the third insulating layer 141*c* by a plating process, a second insulating layer 141*b* embedding the third wiring layer 142*c* is formed on the third insulating layer 141*c*, a via hole is processed by with a laser drill, or the like, and then a second wiring layer 142*b* and a third via layer 143*b* are formed by a plating process. In addition, a first insulating layer 141 embedding the second wiring layer 142*b* is formed on the second insulating layer 141*b*. Through a series of processes, a first precursor SA for the build-up structure 140 may be manufactured, and in another example, a more simplified process may be used.

Figure 13:
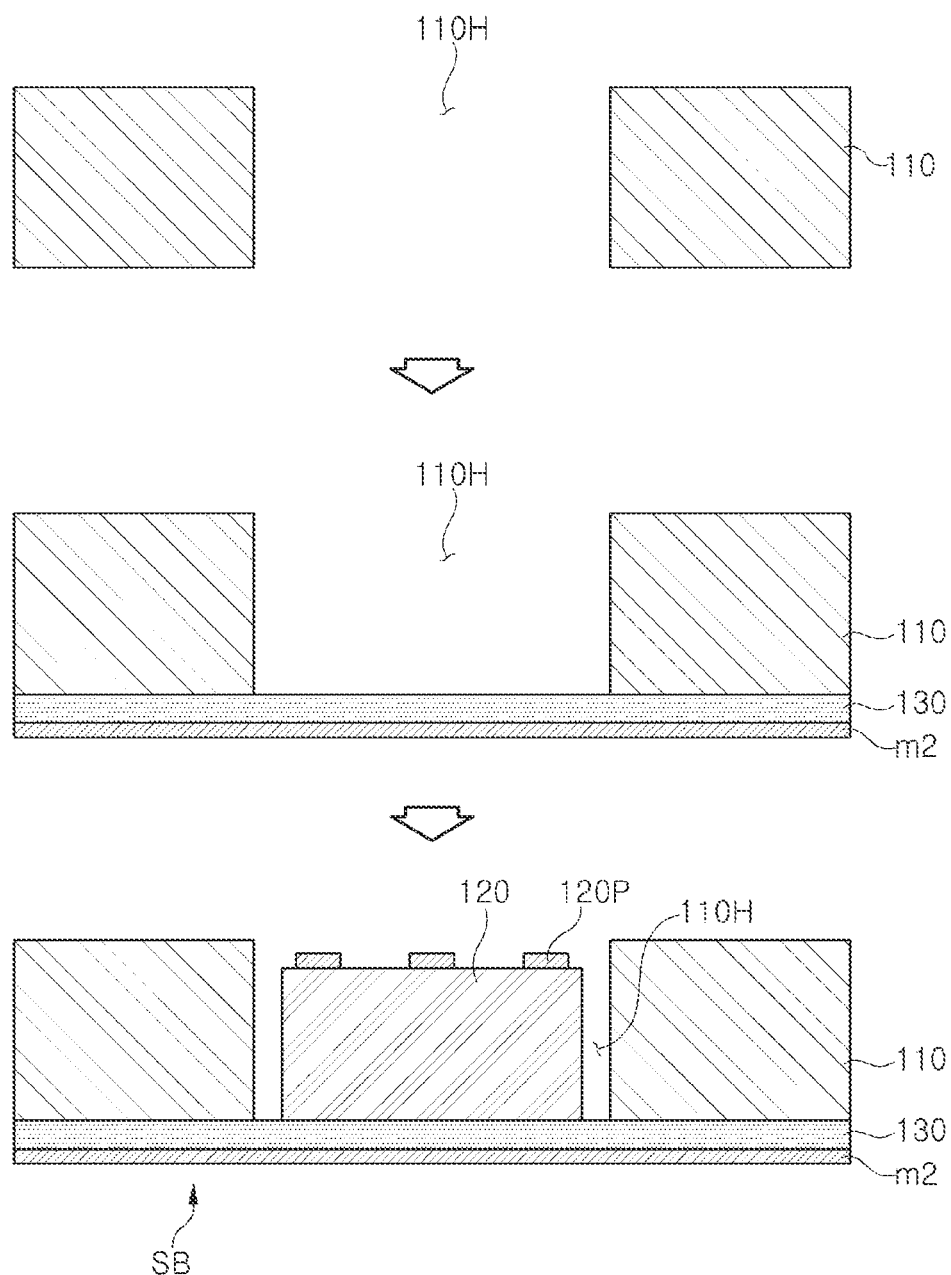

Referring to FIG. 13, first, a core layer 110 is prepared, and a through-portion 110H penetrating through the core layer 110 by laser processing, mechanical processing, or the like, is formed. Next, an encapsulant 130 having a metal foil m2 is attached to a lower surface of the core layer 110. The encapsulant 130 may be a thermosetting material in an uncured state, and may be in contact with the core layer 110. Next, the electronic component 120 is attached to the encapsulant 130 in the through-portion 110H. A heating process may be used to attach the electronic component 120 thereto. Viscosity may be imparted such that viscosity of the uncured encapsulant 130 becomes the lowest viscosity during the heating process. The encapsulant 130 may be adhered to the back surface of the electronic component 120 by a heating process. Through a series of processes, a second precursor SB including the core layer 110 may be manufactured.

Figure 14:
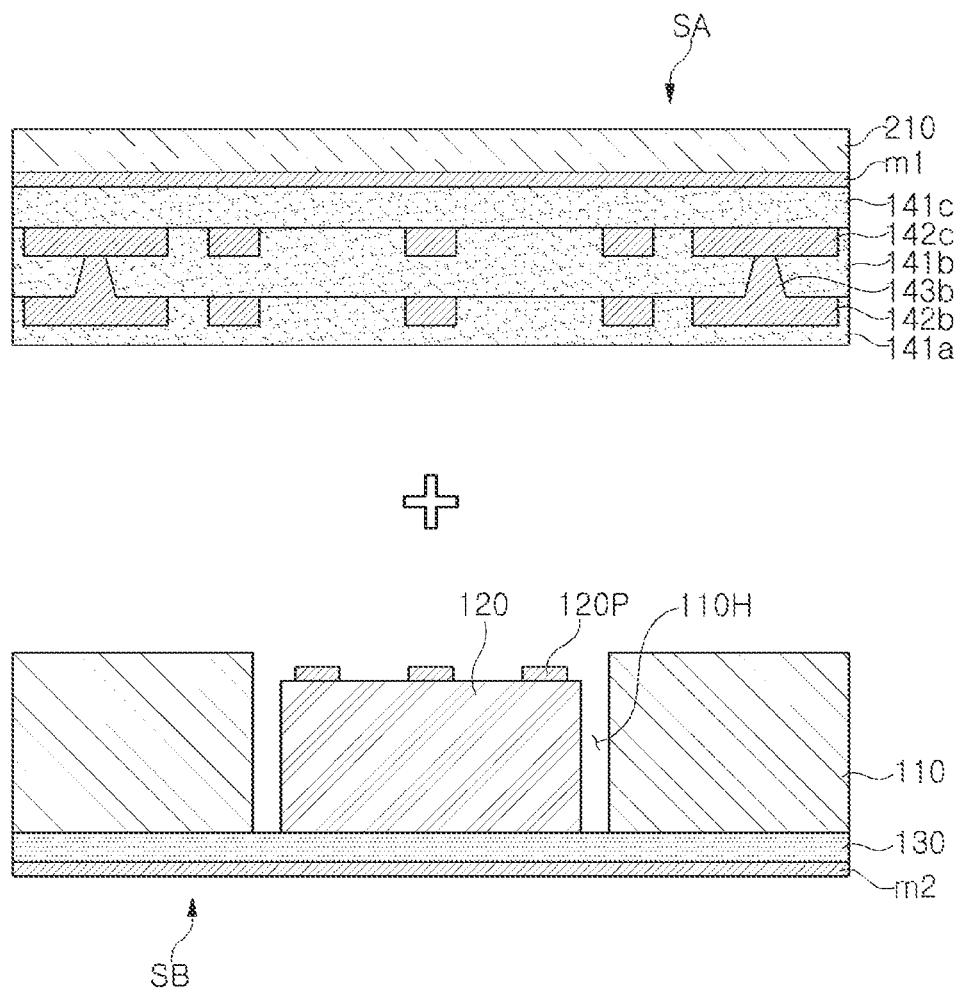

Referring to FIG. 14, the first precursor SA and the second precursor SB are collectively laminated. In this case, the encapsulant 130 may fill the through-portion 110H. If necessary, a heating process may be additionally performed in order to increase fluidity of the encapsulant 130 during the lamination process. After lamination, the uncured or semi-cured materials may be cured by heating, or the like. Next, a carrier 210 is removed from the laminate, a via hole is formed in the laminate by laser processing, and a fourth wiring layer 142*d* and a backside wiring layer 132 and first and second wiring vias Va and Vb are formed by a plating process. In addition, first and second passivation layers 150 and 160, and the like are further formed as necessary. The substrate with the electronic component embedded therein 100B according to the above-described another example may be manufactured through a series of processes, other redundant content thereof will be omitted.

Figure 15:
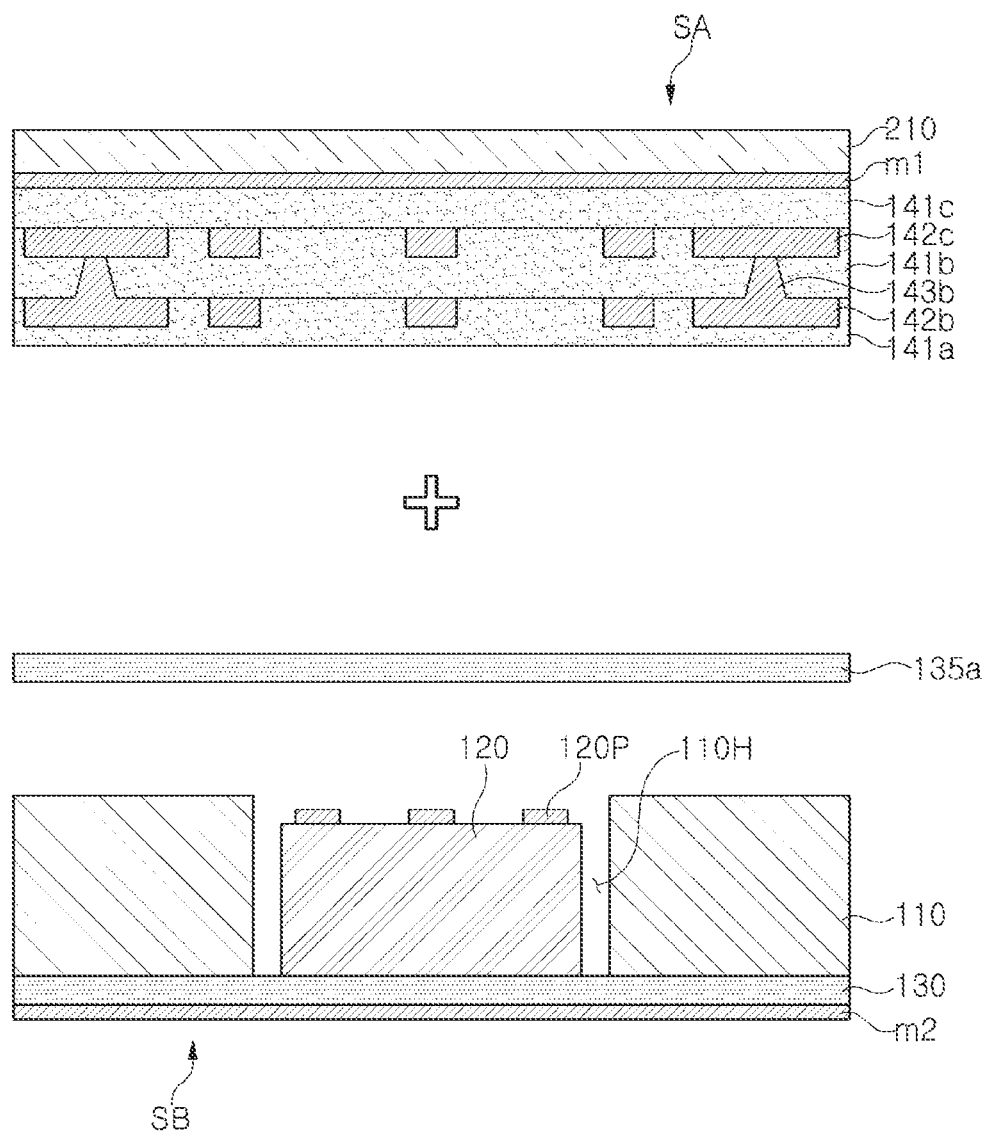
Figure 16:
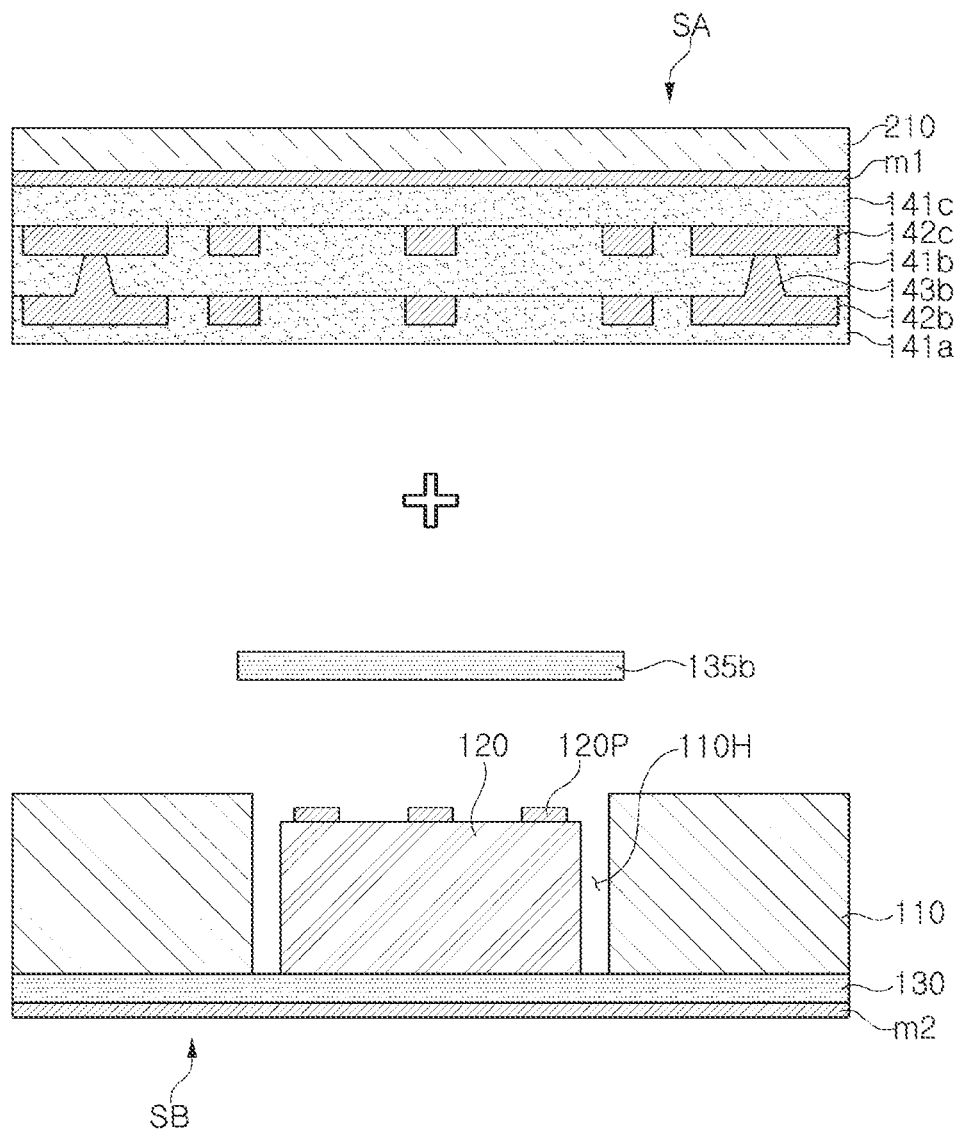

Meanwhile, referring to FIGS. 15 and 16, auxiliary encapsulants 135*a* and 135*b* may be introduced into the collective lamination process in order to secure the filling properties of the through-portion 110H, if necessary. The auxiliary encapsulants 135*a* and 135*b* may fill at least a portion of the through-portion 110H. That is, the encapsulant 130 may consequently be composed of multiple layers. The auxiliary encapsulants 135*a* and 135*b* may include the same material as the encapsulant 130, or may also include other types of NCF. The sizes of the auxiliary encapsulants 135*a* and 135*b* may vary as shown in the drawings.

As set forth above, as one of the various effects of the present disclosure, it is possible to provide a substrate with an electronic component embedded therein having an asymmetrical shape, advantageous for thinning.

In the example embodiments, the terms "side region," "side surface," and the like, may be used to refer to a surface formed taken in right/left directions, the terms "lower side," "lower portion," "lower surface," and the like, may be used to refer to directions facing downwardly with reference to a cross-section in the diagrams for ease of description, and the terms "upper side," "upper portion," "upper surfaces," and the like, may be used to refer to directions opposing the above directions. The notion that an element is disposed on a side region, an upper side, an upper region, or a lower resin may include the configuration in which the element is directly in contact with an element configured as a reference in respective directions, and the configuration in which the element is not directly in contact with the reference element. The terms may be defined as above for ease of description, and the scope of right of the example embodiments is not particularly limited to the above terms.

In the example embodiments, the term "connected" may not only refer to "directly connected" but also include "indirectly connected" by means of an adhesive layer, or the like. Also, the term "electrically connected" may include both of the case in which elements are "physically connected" and the case in which elements are "not physically connected." Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the example embodiments.

In the example embodiments, the term "example embodiment" may not refer to one same example embodiment, but may be provided to describe and emphasize different unique features of each example embodiment. The above suggested example embodiments may be implemented do not exclude the possibilities of combination with features of other example embodiments. For example, even though the features described in one example embodiment are not described in the other example embodiment, the description may be understood as relevant to the other example embodiment unless otherwise indicated.

The terms used in the example embodiments are used to simply describe an example embodiment, and are not intended to limit the present disclosure. A singular term includes a plural form unless otherwise indicated.

While the example embodiments have been shown and described above, it will be apparent to those skilled in the art that modifications and variations could be made without departing from the scope of the present invention as defined by the appended claims.

What is claimed is:

1. A substrate with an electronic component embedded therein, comprising:
   a core layer having a through-portion;
   the electronic component disposed in the through-portion;
   an encapsulant disposed on a lower surface of the core layer, disposed in at least a portion of the through-portion, and covering at least a portion of a lower surface of the electronic component;
   a build-up structure disposed on an upper surface of the core layer, and including a plurality of insulating layers, a plurality of wiring layers, and a plurality of via layers; and
   a first wiring via connecting at least a portion of a first wiring layer, as one of the plurality of wiring layers, to the electronic component,
   wherein the first wiring via penetrates through one of the plurality of insulating layers and at least a portion of the encapsulant,
   a via, among the plurality of via layers, penetrates through the one of the plurality of insulating layers and has a shape tapered in a direction, opposite to the first wiring via, and
   another of the plurality of insulating layers is in contact with the core layer.

2. The substrate with the electronic component embedded therein of claim 1, wherein the encapsulant further covers at least a portion of each of an upper surface and a side surface of the electronic component.

3. The substrate with the electronic component embedded therein of claim 2, wherein the encapsulant is in physical contact with at least a portion of each of the upper surface, the side surface, and the lower surface of the electronic component.

4. The substrate with the electronic component embedded therein of claim 1, wherein the first wiring via has a height, greater than a via of each of the plurality of via layers.

5. The substrate with the electronic component embedded therein of claim 1, wherein the first wiring via also penetrates through a third one of the plurality of insulating layers, and
   another via, among the plurality of via layers, penetrates through the third one of the plurality of insulating layer and has a shape tapered in the same direction as the first wiring via.

6. The substrate with the electronic component embedded therein of claim 1, further comprising a backside wiring layer disposed on a lower surface of the encapsulant; and
   a second wiring via connecting at least a portion of a second wiring layer, as another one of the plurality of wiring layers, to the backside wiring layer,
   wherein the second wiring via penetrates through the core layer and at least a portion of the encapsulant.

7. The substrate with the electronic component embedded therein of claim 6, wherein the first wiring layer is disposed above the second wiring layer.

8. The substrate with the electronic component embedded therein of claim 6, wherein the first and second wiring vias have a shape tapered in directions opposite to each other.

9. The substrate with the electronic component embedded therein of claim 6, wherein the second wiring via further penetrates through an insulating layer covering the second wiring layer of the plurality of insulating layers and in contact with the core layer.

10. The substrate with the electronic component embedded therein of claim 1, wherein the build-up structure has a cavity penetrating through at least one of the plurality of insulating layers and connected to the through-portion.

11. The substrate with the electronic component embedded therein of claim 10, wherein a side portion of the cavity has a step.

12. The substrate with the electronic component embedded therein of claim 10, wherein the cavity comprises a first region having a first planar area on a plane, and a second region having a second planar area, greater than the first planar area on a plane, and
   the first region of the cavity is connected to the through-portion.

13. The substrate with the electronic component embedded therein of claim 1, wherein the electronic component comprises an integrated circuit die having a connection pad disposed on an upper surface thereof.

14. A substrate with an electronic component embedded therein, comprising:
a core layer having a through-portion;
the electronic component disposed in the through-portion;
an encapsulant embedding at least a portion of the electronic component; and
a build-up structure disposed on the core layer, and including a plurality of insulating layers, a plurality of wiring layers, and a plurality of via layers,
wherein a via of a first via layer as one of the plurality of via layers, and a via of a second via layer as another one of the plurality of via layers, penetrate through a same one of the plurality of insulating layers and have a shape tapered in directions opposite to each other,
the via of the first via layer penetrates at least a portion of the encapsulant, and
another of the plurality of insulating layers is in contact with the core layer.

15. The substrate with the electronic component embedded therein of claim 14, wherein the first via layer is disposed above the second via layer,
a width of an upper surface of the via of the first via layer is greater than a width of a lower surface of the via of the first via layer, and
a width of a lower surface of the via of the second via layer is greater than a width of an upper surface of the via of the second via layer.

16. A substrate with an electronic component embedded therein, comprising:
a core layer having a through-portion;
the electronic component disposed in the through-portion and including a connection pad disposed on a first surface of the electronic component;
an encapsulant extending to cover at least a portion of the first surface and at least a portion of a second surface of the electronic component opposing the first surface; and
a build-up structure disposed on a surface of the core layer, and including a plurality of first insulating layers, a plurality of first wiring layers, and a plurality of first via layers,
wherein one via of the plurality of first via layers and another via of the plurality of first via layers penetrate through a same one of the plurality of first insulating layers and have a shape tapered in directions opposite to each other,
the one via of the plurality of first via layers penetrates at least a portion of the encapsulant, and
another of the plurality of first insulating layers is in contact with the core layer.

17. The substrate with the electronic component embedded therein of claim 16, comprising:
one or more second wiring layers disposed on another surface of the core layer,
wherein the number of the plurality of first wiring layers is greater than the number of the one or more second wiring layers.

18. The substrate with the electronic component embedded therein of claim 17, further comprising a second via layer extending from one of the one or more second wiring layers to connect to one of the plurality of first wiring layers,
wherein a via of the second via layer and the one via of the plurality of first via layers connected to the connection pad have a shape tapered in directions opposite to each other.

19. The substrate with the electronic component embedded therein of claim 16, wherein the build-up structure has a cavity penetrating through one or more of the plurality of first insulating layers, and
the cavity is connected to the through-portion.

20. The substrate with the electronic component embedded therein of claim 16, wherein two wiring layers among the first wiring layers are respectively disposed on opposing surfaces of one of the plurality of first insulating layers, and
each of the two wiring layers protrudes from the one of the plurality of first insulating layers.

21. The substrate with the electronic component embedded therein of claim 16, wherein a height of the one via is different from a height of the another via.

* * * * *